United States Patent [19] [11] 4,296,193
Moriya et al. [45] Oct. 20, 1981

[54] PHOTOSENSITIVE POSITIVE DIAZO MATERIAL WITH COPOLYMER OF ACRYLAMIDE AND DIACETONEACRYLAMIDE AND A PROCESS FOR DEVELOPING TO FORM COLOR RELIEF IMAGE

[75] Inventors: Takeo Moriya, Kawagoe; Toshio Yamagata, Urawa, both of Japan

[73] Assignee: Kimoto & Co., Ltd., Tokyo, Japan

[21] Appl. No.: 161,513

[22] Filed: Jun. 20, 1980

[30] Foreign Application Priority Data

Jan. 16, 1980 [JP] Japan .................................. 55-3407

[51] Int. Cl.$^3$ .......................... G03C 1/60; G03C 1/71; G03C 1/74; G03C 5/34

[52] U.S. Cl. ........................................ 430/149; 430/5; 430/150; 430/157; 430/176; 430/292; 430/294; 430/295; 430/326

[58] Field of Search ............... 430/176, 175, 326, 149, 430/157, 150, 196, 197, 294, 292, 295

[56] References Cited

U.S. PATENT DOCUMENTS 2,687,958 8/1954 Neugebauer ........................ 430/197
2,702,242 2/1955 Neugebauer et al. ............... 430/149
3,544,317 12/1970 Yonezawa ............................ 430/175
3,756,823 9/1973 Ten Haaf et al. .................... 430/149
3,884,703 5/1975 Oba et al. ............................. 430/196
3,900,325 8/1975 Christenson et al. ............... 430/191
4,086,090 4/1978 Kohashi et al. ...................... 430/325
4,215,191 7/1980 Kwok .................................. 430/192

Primary Examiner—Charles L. Bowers, Jr.
Attorney, Agent, or Firm—Kenway & Jenney

[57] ABSTRACT

A photosensitive material and a process for developing the same are disclosed.

The photosensitive material is obtained by forming on a base material a layer of photosensitive composition comprising (A), 100 weight parts of a water soluble resin binder containing at least 60 weight % of acrylamide-diacetoneacrylamide copolymer, the copolymerization ratio of acrylamide and diacetoneacrylamide being 8:2–5:5 and average polymerization degree being 300–1500, and (B), 5–20 weight parts of a water soluble diazonium salt.

The photosensitive material is developed by using an aqueous alkali solution.

7 Claims, No Drawings

PHOTOSENSITIVE POSITIVE DIAZO MATERIAL WITH COPOLYMER OF ACRYLAMIDE AND DIACETONEACRYLAMIDE AND A PROCESS FOR DEVELOPING TO FORM COLOR RELIEF IMAGE

BACKGROUND OF THE INVENTION (1) Field of the Invention

This invention relates to an improved positive type photosensitive material and a process for developing the same, and more particularly to a photosensitive reproduction material which is able to give an excellent color-developed positive relief image by developing the exposed photosensitive material with an aqueous alkali solution and washing it with water.

(2) Description of the prior art

In the past, the following processes have been employed to obtain a positive relief image using ultraviolet rays as a light source.

(1) A layer of photosensitive composition consisting of o-quinonediazide derivative and alkali soluble resin binder (e.g. novolak resin) is formed on a base material to obtain a photosensitive reproduction material. The photosensitive reproduction material thus obtained is exposed and the exposed areas are alkali-developed.

(2) A layer of photosensitive composition consisting of a reaction product of p-diazodiphenylamine with phosphotungstic acid and a vinylidene chloride-acrylonitrile copolymer binder is formed on a base material to obtain a photosensitive reproduction material. The photosensitive reproduction material thus obtained is exposed and exposed areas are developed by using or water-alcohol solution (see Japanese patent publication No. 42-14326, claiming priority of U.S. Appln. Ser. No. 345,848 filed Feb. 19, 1964).

(3) A layer of photosensitive composition consisting of an ethylenically unsaturated compound, a thermoplastic polymer, a photopolymerization initiator, and a dye or pigment is formed between two support sheets to obtain a photosensitive reproduction material. The photosensitive reproduction material thus obtained is subjected to a development/peel procedure utilizing the change of adhesive strength in the exposed areas, and a relief image is formed by the remaining photosensitive composition (see U.S. Pat. No. 3,060,023).

However, these prior art processes have the following disadvantages and are insufficient to provide images having high density and high resolving power.

That is, in the above-mentioned process (1), the binder resin can not be dyed without difficulty. Further, it is difficult to combine the binder resin with an efficient color developing mechanism. For this reason, a dye or pigment is usually dispersed in the binder resin and, in order to obtain high light shielding density, a long period of exposure is necessary and practically disadvantageous.

In the above-mentioned process (2), high light shielding density can be obtained without decreasing sensitivity by providing a light shielding layer on the photosensitive layer which is formed on a transparent base material, but in this case exposure can be made only from the transparent base material side and the decrease of resolving power due to the thickness of the base material is unavoidable.

Further, the above-mentioned process (3) has the same disadvantage as process (2), because exposure is made through the transparent base material. Additionally, since development is made by agglutination and destruction of the photosensitive layer, the resolving power is lower. Another disadvantage in the process (3) is the high price of the photosensitive material.

SUMMARY OF THE INVENTION

The present inventors have now found that exposed areas wash out in water and unexposed areas are hardened to form a positive image, when a photosensitive composition which is a combination of a water soluble resin acrylamide-diacetoneacrylamide copolymer with a water soluble diazonium salt is coated onto a base material, exposed and alkali-treated.

This phenomenon is peculiar to a acrylamidediacetoneacrylamide copolymer. When another water soluble resin (e.g. polyacrylamide, fish glue, polyvinylpyrolidone, acacia (gum arabic), gelatin, albumin, casein, methylcellulose, ethylcellulose, hydroxyethylcellulose, carboxymethylcellulose, starch, etc.) was used instead of the acrylamide-diacetoneacrylamide copolymer, the phenomenon was not observed.

Accordingly, an object of the present invention is to provide a photosensitive reproduction material which is able to give an excellent color-developed positive relief image.

A further object is to provide a process for developing the photosensitive reproduction material.

These and other objects of the invention will become apparent from the following description of embodiments thereof.

DESCRIPTION OF THE PREFERRED EMBODIMENTS

The above-mentioned objects of the present invention are provided by a photosensitive material which is obtained by forming on a base material a layer of photosensitive composition comprising (A), 100 weight parts of a water soluble resin binder containing at least 60 weight % of acrylamide-diacetoneacrylamide copolymer, the copolymerization ratio of acrylamide and diacetoneacrylamide being 8:2–5:5 and average polymerization degree being 300–1500, and (B), 5–20 weight parts of a water soluble diazonium salt and by a process for developing said photosensitive material with an alkali.

With regard to the acrylamide-diacetoneacrylamide copolymer (A) used in the present invention, the copolymerization ratio of 8:2–5:5 and average polymerization degree of 300–1500 give desirable results. If the ratio of acrylamide/diacetoneacrylamide is more than the above-mentioned value, the alkali hardened film in the unexposed areas becomes weak and is apt to be removed by water washing. If it is less than the above-mentioned value, the lower water solubility of the copolymer makes it difficult to prepare a photosensitive coating solution. When the average polymerization degree is less than 300, the hardened film in the unexposed areas becomes weak and is apt to be removed by water washing. In contrast, if it exceeds 1500, the photosensitive coating solution becomes so viscous that it can not be easily prepared. Besides, lower water solubility in the exposed areas causes difficulty in development.

As the water soluble resin binder in the present invention, the acrylamide-diacetoneacrylamide copolymer may be used singly, but 40 weight % or less of other water soluble resins may be employed together with the acrylamidediacetoneacrylamide copolymer.

Other suitable water soluble resins, include polyacrylamide, polyvinylpyrrolidone, etc.

Water soluble diazonium salts suitable for use in the present invention include p-N-ethyl-N-hydroxyethyl-aminobenzenediazonium zinc chloride salt, 4-(p-tolyl-mercapto)-2,5-dimethoxy-benzenediazonium zinc chloride salt, 4-(p-tolylmercapto)-2,5-diethoxy-benzenediazonium zinc chloride or boron tetrafluoride salt, 4-(p-methyl-benzoylamino)-2,5-diethoxy-benzenediazonium zinc chloride salt, 4-benzamide-2,5-dibutoxy-benzendiazonium chloride ½ zinc chloride salt, 4-(N-cyclohexyl-N-methylamino)-3-chlorobenzene diazonium chloride ½ zinc chloride salt, 1-diazo-3-chloro-4-N,N-diethylamino-benzene chloride ½ zinc chloride salt, 1-diazo-2,5-diethoxy-4-benzoylamino-benzene chloride ½ zinc salt, 1-diazo-4-(N-ethyl-N-benzyl-)amino-benzene chloride ½ zinc chloride salt, 1-diazo-2,5-dimethoxy-4-p-tolylmercapto-benzene chloride ½ zinc chloride salt, 1-diazo-2,5-diethoxy-4-p-tolylmercapto-benzene chloride zinc salt, 1-diazo-3-ethoxy-4-N-methyl-N-benzylamino-benzene chloride ½ zinc salt, 1-diazo-3-chloro-4-N,N-diethylamino-benzene chloride ½ zinc salt, 1-diazo-2,5-diethoxy-4-p-tolylaminobenzene chloride ½ zinc salt, 1-diazo-3-chloro-4-N-methyl-N-cyclohexylamino-benzene chloride ½ zinc chloride salt, and so on. In alkali development, these diazonium salts harden a water soluble resin binder in the unexposed areas. The preferable amount of the diazonium salt is 5–20 weight parts per 100 weight parts of the water soluble resin binder. When the amount of the diazonium salt is less than 5 weight parts, hardening in the unexposed areas becomes insufficient. On the other hand, if the amount of the diazonium salt is more than 20 weight parts, the solubility of the diazonium salt in the acrylamide-diacetone-acrylamide copolymer becomes worse and, after a photosensitive layer is coated and dried, the diazonium salt bleeds from the surface of coated film to reduce sensitivity.

If necessary, one or more stabilizing agents may be used to stabilize the above-mentioned known diazonium salt.

These components are dissolved in water as solvent, coated on a base material having a smooth or mat-like surface, and dried at a temperature less than 100° C. to form a photosensitive layer with a film thickness of 2–10μ. In order to control the adhesive strength of the base material and the photosensitive layer, a suitable lower layer may be formed on the base material. Suitable base material for use in the present invention include sheets of thermoplastic or thermosetting polymers, glasses, metals, and so on. Suitable thermoplastic polymers include synthetic resins such as polyethyleneterephthalate, polycarbonate, polyamide, polypropylene, polyvinylchloride, polystyrene, polymethacrylate, and their copolymers as well as cellulose derivatives such as diacetylcellulose, triacetylcellulose, propylcellulose, and mixed cellulose esters.

If necessary, the base material may be blended with additives such as dyes, pigments, fillers, etc. to improve drawing and coloring properties.

The base material is generally used in the form of a transparent sheet, but it may be used in other forms.

An aqueous alkali solution having a pH value of 12.5–12.95 or ammonia vapor is used for the development of the photosensitive material. The preferred alkali solutions are aqueous solutions of strong alkali such as potassium hydroxide and sodium hydroxide.

When the diazonium salt reacts with the acrylamidediacetoneacrylamide copolymer in the presence of the alkali, color development occurs and a hard layer is formed on the unexposed areas.

When an aqueous alkali solution is used, a coupler which reacts with the diazonium salt (B) to form an azo dye, may be added to the aqueous alkali solution to provide a more densified color development.

Suitable couplers include 2,3-dihydroxynaphthalene, 2,4-2',4'-tetrahydroxydiphenyl, phloroglucinol, acetoacetoglycineamide, acetoacetobenzylamide, cyanoacetomorpholide, 1,10-dicyanoacetotriethylenetetramine, 1,4-bis-acetoacetoethylenediamine, 1-phenyl-3-methyl-5-pyrazolone, etc.

After the photosensitive material in the present invention is exposed in the usual manner, for example, by placing a manuscript between a ultraviolet source and the photosensitive material, it is developed by exposing it to ammonia vapor or by immersing it in a developer at room temperature for 0.5–2 minutes to harden the unexposed areas and then removing the exposed areas by water washing.

The time of development can be shortened by increasing the temperature of development. Water washing can be performed with city water at a rate of up to 3.0 kg/cm$^2$.

The sheet material developed in the above-mentioned manner is suitably used as a mask plate in map printing where high accuracy is required because a relief image, which is faithful to a manuscript, is formed on the surface thereof.

EXAMPLE 1

Ten grams of acrylamide-diacetoneacrylamide copolymer (average polymerization degree=700, copolymerization ratio of acrylamide/diacetoneacrylamide=6/4) and 0.71 gram of p-N-ethyl-N-hydroxyethylaminobenzenediazonium zinc chloride salt were dissolved in 133 grams of water to prepare an aqueous solution of photosensitive composition with a solids content of 7.45%.

The aqueous solution of photosensitive composition was coated on one side of polyethyleneterephthalate film with a thickness of 100μ by means of a wirebar so that the thickness of coated film after drying will become 3.5μ, and the coated film was dried for 3 minutes at 90° C. to give an image forming material.

A positive manuscript was brought into intimate contact with the obtained photosensitive film, which was then exposed by irradiating with a 3 kW arc light from a distance of 75 cm for 2.5 minutes.

The photosensitive material thus exposed was immersed for 2 minutes in a developer which was obtained by dissolving 10 g of sodium hydroxide in 990 g of water, and washed with a shower of ca. 1 kg/cm$^2$. By this shower washing, a faint but sharp blue-violet positive relief image was obtained on the base film.

When the formed image was immersed in a 2% aqueous solution of Congo Red at 30° C. for 3 minutes, it turned into a dark-red colored image, which showed a transmission density of 2.65 when a Wratten 18A filter was used for a Macbeth TD-504A densitometer.

EXAMPLE 2

A solution of photosensitive composition with a solids content of 7.64% was prepared by dissolving 10 g of the same acrylamide-diacetoneacrylamide copolymer as used in Example 1 and 1 g of 4-(p-tolylmercapto)-2,5-dimethoxybenzene-diazonium zinc chloride salt in 133 g of water.

The solution of the photosensitive composition was coated on one side of polyethyleneterephthalate film with a thickness of 100μ by means of a wirebare so that the thickness of coated film after drying became 3.5μ, and the coated film was dried for 3 minutes at 90° C. to give an image forming material.

A negative manuscript of line drawing was brought into intimate contact with the obtained photosensitive film, which was then exposed by irradiating with a 3 kW arc light from a distance of 75 cm for 5 minutes.

The photosensitive material thus exposed was immersed for 2 minutes in a developer which was obtained by dissolving 10 g of sodium hydroxide and 10 g of 2,4-2',4'-tetrahydroxydiphenylsulfate in 980 g of water, and shower washed with city water. By this shower washing, the photosensitive film of the exposed areas was removed and a negative relief image of line drawing, which was faithful to the red colored manuscript, was obtained.

The colored coated film had a density of 2.0 when a Wratten 18A filter was used for a Macbeth TD-504A densitometer. Its image resolving power was 18 lines/mm.

Further, the coated film area which was surrounded by transparent line drawing removed by water washing was peeled off by a needle to obtain an excellent mask material for plate making.

EXAMPLE 3

A sharp positive relief image was obtained in the same manner as in Example 1 except that the exposed photosensitive material was developed with ammonia gas.

EXAMPLE 4

A positive relief image was obtained in the same manner as in Example 1 except that, as the water soluble binder, there was used a mixture of 9 g of acrylamide-diacetoneacrylamide copolymer used in Example 1 and 1 g (solid basis) of acacia (gum arabic).

Thus, there is provided in accordance with the invention a photosensitive material and a process for developing the same which has the advantage discussed above. The embodiments described are intended to be merely exemplary and those skilled in the art will be able to make variations and modifications in them without departing from the spirit and scope of the invention. All such modifications and variations are contemplated as falling within the scope of the claims.

What is claimed is:

1. A photosensitive material comprising a base material and a layer of a positive image forming, alkali developable photosensitive composition wherein, after exposure to light, the light exposed areas are removable by washing, and said layer is formed on said base material, said photosensitive composition comprising (A), 100 parts by weight of a water soluble resin binder containing at least 60 weight % of acrylamide-diacetoneacrylamide copolymer, the copolymerization of acrylamide to diacetoneacrylamide being 8:2–5:5 and the average polymerization degree being 300–1500, and (B), 5–20 parts by weight of a water-soluble, photosensitive diazonium salt.

2. A photosensitive material according to claim 1, wherein the water soluble resin binder is a single acrylamide-diacetoneacrylamide copolymer.

3. A photosensitive material according to claims 1 or 2, wherein the base material is a sheet material of thermoplastic or thermosetting polymer, metal or glass.

4. A process for forming a color-developed positive relief image comprising: forming on a base material, a layer of a positive-image forming, alkali developable photosensitive composition comprising (A), 100 parts by weight of a water soluble resin binder containing at least 60 weight % of acrylamidediacetoneacrylamide copolymer, the polymerization ratio of acrylamide and diacetoneacrylamide being 8:2–5:5 and average polymerization degree being 300–1500, and (B), 5–20 parts by weight of a water-soluble, photosensitive diazonium salt;
    exposing said photosensitive material to form an image thereon; and
    developing said exposed photosensitive material by contact with an alkali developer.

5. A process in accordance with claim 4, wherein said alkali developer is an aqueous alkali solution having a pH of 12.5–12.95.

6. A process in accordance with claim 4, wherein said alkali developer is an aqueous alkali solution containing, dissolved therein, a coupler which reacts with the water soluble diazonium salt (B) to form an azo dye.

7. A process in accordance with claim 4, wherein said alkali developer is ammonia vapor.

* * * * *

UNITED STATES PATENT AND TRADEMARK OFFICE
CERTIFICATE OF CORRECTION

PATENT NO. : 4,296,193
DATED : 20 October 1981
INVENTOR(S) : Takeo Moriya et al

It is certified that error appears in the above—identified patent and that said Letters Patent is hereby corrected as shown below:

Claim 1, line 9 (col. 6, line 14) insert ---ratio--- after "copolymerization".

Signed and Sealed this

Ninth Day of February 1982

[SEAL]

Attest:

Attesting Officer

GERALD J. MOSSINGHOFF

Commissioner of Patents and Trademarks